US012787829B2

(12) United States Patent
Kim

(10) Patent No.: US 12,787,829 B2
(45) Date of Patent: Nov. 3, 2026

(54) PACKAGING SUBSTRATE HAVING CAVITY PORTIONS AND METHOD OF MANUFACTURING THE SAME

(71) Applicant: Absolics Inc., Covington, GA (US)

(72) Inventor: Sungjin Kim, Covington, GA (US)

(73) Assignee: Absolics Inc., Covington, GA (US)

(*) Notice: Subject to any disclaimer, the term of this patent is extended or adjusted under 35 U.S.C. 154(b) by 352 days.

(21) Appl. No.: 18/458,157

(22) Filed: Aug. 30, 2023

(65) Prior Publication Data

US 2025/0079243 A1 Mar. 6, 2025

(51) Int. Cl.

| | |
|---|---|
| ***H10W 70/68*** | (2026.01) |
| ***H10W 70/05*** | (2026.01) |
| ***H10W 70/60*** | (2026.01) |
| ***H10W 70/685*** | (2026.01) |
| ***H10W 70/692*** | (2026.01) |
| ***H10W 90/00*** | (2026.01) |

(52) U.S. Cl.

CPC ......... *H10W 70/68* (2026.01); *H10W 70/095* (2026.01); *H10W 70/611* (2026.01); *H10W 70/685* (2026.01); *H10W 70/692* (2026.01); *H10W 90/00* (2026.01); *H10W 70/682* (2026.01); *H10W 90/722* (2026.01); *H10W 90/724* (2026.01)

(58) Field of Classification Search

CPC . H10W 70/68; H10W 70/095; H10W 70/611; H10W 70/685; H10W 70/692; H10W 90/00; H10W 70/682; H10W 90/722; H10W 90/724

See application file for complete search history.

(56) References Cited

U.S. PATENT DOCUMENTS

| | | | | |
|---|---|---|---|---|
| 6,690,583 B1 * | 2/2004 | Bergstedt | H01L 24/82 | 361/767 |
| 6,919,508 B2 * | 7/2005 | Forcier | H05K 1/185 | 257/E23.092 |
| 2007/0187137 A1 * | 8/2007 | Isebo | H01L 23/15 | 174/262 |
| 2011/0217657 A1 * | 9/2011 | Flemming | H01L 21/486 | 29/874 |

(Continued)

FOREIGN PATENT DOCUMENTS

| | | | |
|---|---|---|---|
| CN | 113097201 A * | 7/2021 | H01L 25/18 |
| CN | 115917730 | 4/2023 | |

(Continued)

OTHER PUBLICATIONS

Machine Translation; CN 113097201 A; Jul. 9, 2021; Li, Wei-Ping (Year: 2021).*

*Primary Examiner* — Scott B Geyer

(74) *Attorney, Agent, or Firm* — JCIP GLOBAL INC.

(57) ABSTRACT

An embodiment relates to a packaging substrate and a method of manufacturing the same. The packaging substrate according to the embodiment includes a core layer, wherein the core layer may include a glass substrate including a first surface and a second surface facing each other, and at least two or more cavity portions each having an opening open in a direction toward the first surface or a direction toward the second surface and having different depths. Accordingly, various types of cavity elements may be mounted without undulation.

4 Claims, 8 Drawing Sheets

(56) References Cited

U.S. PATENT DOCUMENTS

| | | | | |
|---|---|---|---|---|
| 2011/0316169 | A1* | 12/2011 | Sunohara | H01L 23/49827 257/E21.597 |
| 2014/0357020 | A1* | 12/2014 | Aleksov | H01L 24/83 438/107 |
| 2016/0111395 | A1* | 4/2016 | Heinrich | H01L 25/0655 438/107 |
| 2018/0277395 | A1* | 9/2018 | Masukawa | H05K 3/4629 |
| 2020/0045824 | A1 | 2/2020 | Huang et al. | |
| 2020/0152557 | A1* | 5/2020 | Lim | H01L 23/13 |
| 2021/0066199 | A1* | 3/2021 | Feichtinger | H01L 23/5389 |
| 2021/0091032 | A1* | 3/2021 | Bonam | H01L 23/3135 |
| 2022/0293504 | A1* | 9/2022 | Li | H01L 25/105 |
| 2022/0293547 | A1* | 9/2022 | Li | H01L 25/105 |
| 2022/0320028 | A1* | 10/2022 | Li | H01L 24/20 |
| 2023/0080454 | A1 | 3/2023 | Pietambaram et al. | |
| 2023/0125605 | A1 | 4/2023 | Tanaka et al. | |
| 2023/0162992 | A1 | 5/2023 | Fukushima et al. | |
| 2023/0300975 | A1* | 9/2023 | Proschwitz | H01L 25/0652 257/773 |
| 2024/0055397 | A1* | 2/2024 | Raman | H01L 23/13 |
| 2024/0136238 | A1* | 4/2024 | Mao | H01L 23/562 |

FOREIGN PATENT DOCUMENTS

| | | | | |
|---|---|---|---|---|
| EP | 3474639 | | 4/2019 | |
| JP | 2005340713 | | 12/2005 | |
| JP | 2008177506 | | 7/2008 | |
| JP | 2020109821 | A * | 7/2020 | H10W 74/114 |
| JP | 2023052130 | | 4/2023 | |
| KR | 101364088 | B1 * | 2/2014 | H01L 23/12 |
| KR | 1020140082305 | | 7/2014 | |
| KR | 20170047674 | | 5/2017 | |
| KR | 1020220128587 | | 9/2022 | |
| TW | 202139406 | | 10/2021 | |
| WO | 2021200406 | | 10/2021 | |

* cited by examiner

PACKAGING SUBSTRATE HAVING CAVITY PORTIONS AND METHOD OF MANUFACTURING THE SAME

BACKGROUND

1. Field of the Invention

The embodiments relate to a semiconductor packaging substrate and a method of manufacturing the semiconductor packaging substrate, and more particularly, to a packaging substrate including a glass substrate and a method of manufacturing the same.

2. Discussion of Related Art

In manufacturing electronic components, implementing a circuit on a semiconductor wafer is called as a front-end (FE) process, assembling the wafer in a state of being usable in an actual product is called as a back-end (BE) process, and a packaging process is included in subsequent processes.

Four core technologies of semiconductor industry, which recently enabled rapid development of electronic products, include semiconductor technology, semiconductor packaging technology, manufacturing process technology, and software technology. Semiconductor technology has developed in various forms, such as nanoscale (submicron) line widths, 10 million cells or more, high-speed operation, large heat dissipation, and the like, but a relatively perfect packaging technology is not supported. Accordingly, the electrical performance of a semiconductor can sometimes be determined by the packaging technology and the electrical connection according to the packaging technology rather than performance of the semiconductor technology itself.

Although a ceramic or resin has been applied as a material of a packaging substrate, recently, research on applying silicon or glass for a high-end packaging substrate has been performed, and specifically, a packaging substrate having a cavity structure has been developed by applying a glass substrate.

Meanwhile, a re-distribution layer (RDL) in the packaging process refers to a generic technology of changing a position of a previously formed electrical terminal (for example: an Al pad) to an arbitrary position using a wafer level package (WLP) process technology. This RDL is used as a method of solving a design limitation in a semiconductor manufacturing process through a package, that is, is used in semiconductor chip stacking.

RELATED ART DOCUMENTS

Patent Documents

US Patent Laid-Open Application US20230162992A1

Korean Patent Laid-Open Application No. 10-2014-00082305

SUMMARY OF THE INVENTION

An embodiment is directed to providing a packaging substrate that alleviates undulation, which occurs when various types of elements are mounted, in a glass substrate and a packaging substrate in which a plurality of elements are mounted in the glass substrate, and a method of manufacturing the same.

Further, an embodiment is directed to providing a packaging substrate in which cavities of various depths are disposed corresponding to the design of elements having various heights, and a method of manufacturing the same.

In addition, an embodiment is directed to forming a flat insulating layer on a glass substrate and forming a flat upper layer on the insulating layer.

In order to achieve the above object, a packaging substrate according to one embodiment includes a core layer, wherein the core layer includes a glass substrate including a first surface and a second surface facing each other, and at least two or more cavity portions each having an opening open in a direction toward the first surface of the glass substrate and having different depths.

The two or more cavity portions may have different depths.

The packaging substrate may include at least two or more cavity elements arranged in the cavity portions and having different heights, and an insulating layer incorporated into the cavity portion, and formed on the first surface of the glass substrate.

The cavity portion may include a first cavity portion which is open and recessed in the direction toward the first surface and has a first depth, and a second cavity portion which is open and recessed in the direction toward the first surface and has a second depth deeper than the first depth, the cavity element may include a first cavity element arranged in the first cavity portion, and a second cavity element arranged in the second cavity portion, one or more connection electrodes may be disposed on the first cavity element in the direction toward the first surface, and one or more connection electrodes may be disposed on the second cavity element in the direction toward the first surface.

A cavity portion according to another embodiment may include a first cavity portion which is open and recessed in the direction toward the first surface and has a first depth, a second cavity portion which is open and recessed in the direction toward the first surface and has a second depth deeper than the first depth, and a third cavity portion which has a third depth passing through the first surface and the second surface, and in this case.

A first cavity element may be arranged in the first cavity portion, a second cavity element may be arranged in the second cavity portion, and a third cavity element may be arranged in the third cavity portion.

One or more connection electrodes may be disposed on the first cavity element in the direction toward the first surface. One or more connection electrodes may be disposed on the second cavity element in the direction toward the first surface. And one or more connection electrodes may be disposed on the third cavity element in the direction toward the first surface.

In this case, one or more connection electrodes may be further disposed in a direction toward the second surface with the third cavity element therebetween.

In order to achieve the above object, a method of manufacturing a packaging substrate according to one embodiment includes: forming a plurality of defects of different degrees on a first surface of a glass substrate including the first and second surfaces facing each other; and etching the first surface to form at least two or more cavity portions having different depths.

The method may further include arranging cavity elements having different heights in the cavity portions, and forming an insulating layer on the first surface.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
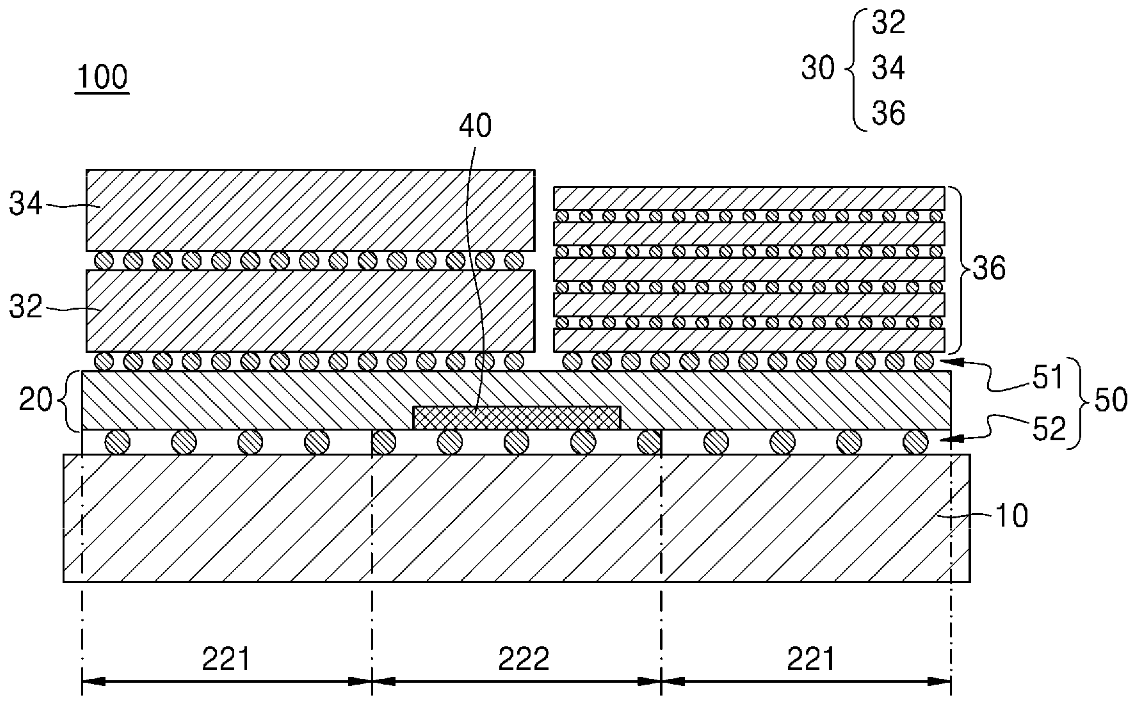
FIG. 1 is a conceptual diagram for describing a cross-sectional structure of a packaging substrate according to an embodiment.

Hereinafter, embodiments will be described in detail with reference to the accompanying drawings, which may allow those skilled in the art to easily perform the present disclosure. The embodiments may be implemented in various forms and are not limited to embodiments described herein. Like reference numerals are used for like components throughout the specification.

Throughout the present specification, the term "combination thereof" included in expression of the Markush form refers to a mixture or combination of one or more selected from a group consisting of components disclosed in the expression of the Markush form, and refers to including the one or more selected from the group consisting of the components.

Throughout the present specification, terms such as "first," "second" or "A," "B" are used to distinguish the same terms. Further, a singular form includes a plural form unless otherwise defined in the context.

In the present specification, "~-based" may refer to including a compound corresponding to "~" or a derivative of the "~" in the compound.

In the present specification, the expression B is located on A means that B is directly located on A or B is located on A while another layer is located therebetween, and is not interpreted as being limited to B being located on A while in contact therewith.

In the present specification, the expression B is connected to A means that B is directly connected to A or B is connected to A through another component therebetween, and is not interpreted as being limited to B being directly connected to A unless otherwise specifically mentioned.

In the present specification, a singular form is interpreted as a meaning including a singular form or plural form unless otherwise specifically described.

In a process of developing a semiconductor device capable of exhibiting high performance while being more integrated and having a thinner thickness, while recognizing that not only an element itself but also packaging is an important factor in performance improvement and researching this, the present inventors found that a packaging substrate may become relatively thinner and become helpful for improving the electrical characteristics of the semiconductor device by a method of applying a glass core as a single layer, applying a cavity structure, and the like unlike applying a core of two layers or more, such as a conventional interposer and an organic substrate, on a motherboard as a packaging substrate, and completed the invention.

Elements, which perform various functions, may be mounted in a cavity structure of a glass substrate, and accordingly, a thin packaging substrate may be formed. Since the elements mounted in the cavity structure have various sizes and heights according to the type thereof, in the same cavity structure, undulation due to a height difference between elements, that is, defects in the form of waves with curves or peaks and valleys may occur. This undulation has the possibility of affecting the lightening and thinning of the packaging substrate, and weakening electrical characteristics as well.

Accordingly, as a result of repeated research, when the cavity structure for mounting the elements in the glass substrate is formed, the invention was completed by identifying that undulation can be improved by adjusting an etching degree in consideration of the heights or sizes of the elements.

Figure 2:
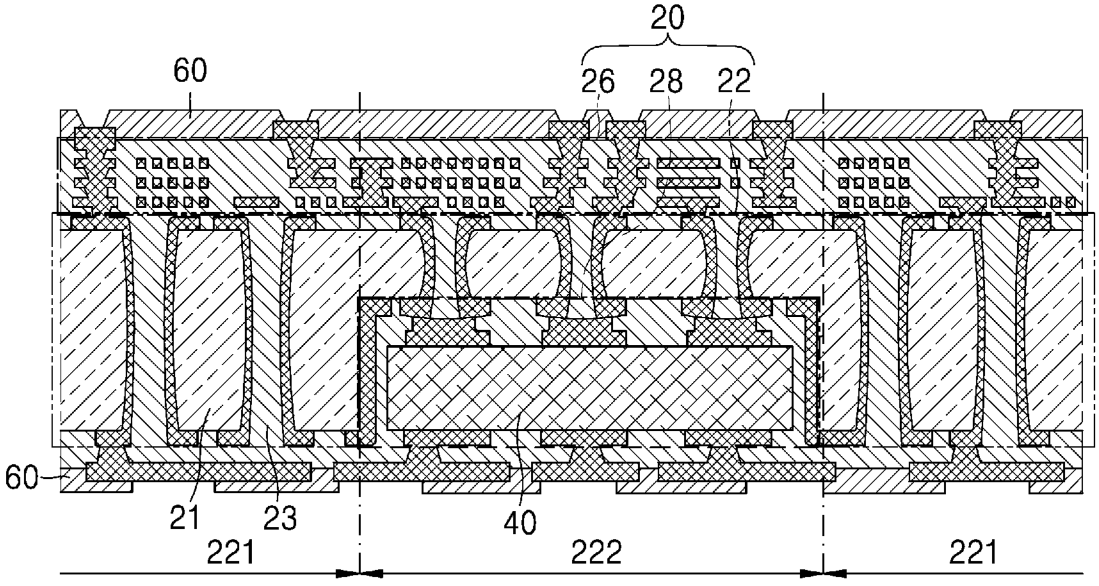
FIG. 2 is a conceptual diagram for describing a cross-sectional structure of a packaging substrate according to another embodiment.
Figure 3:
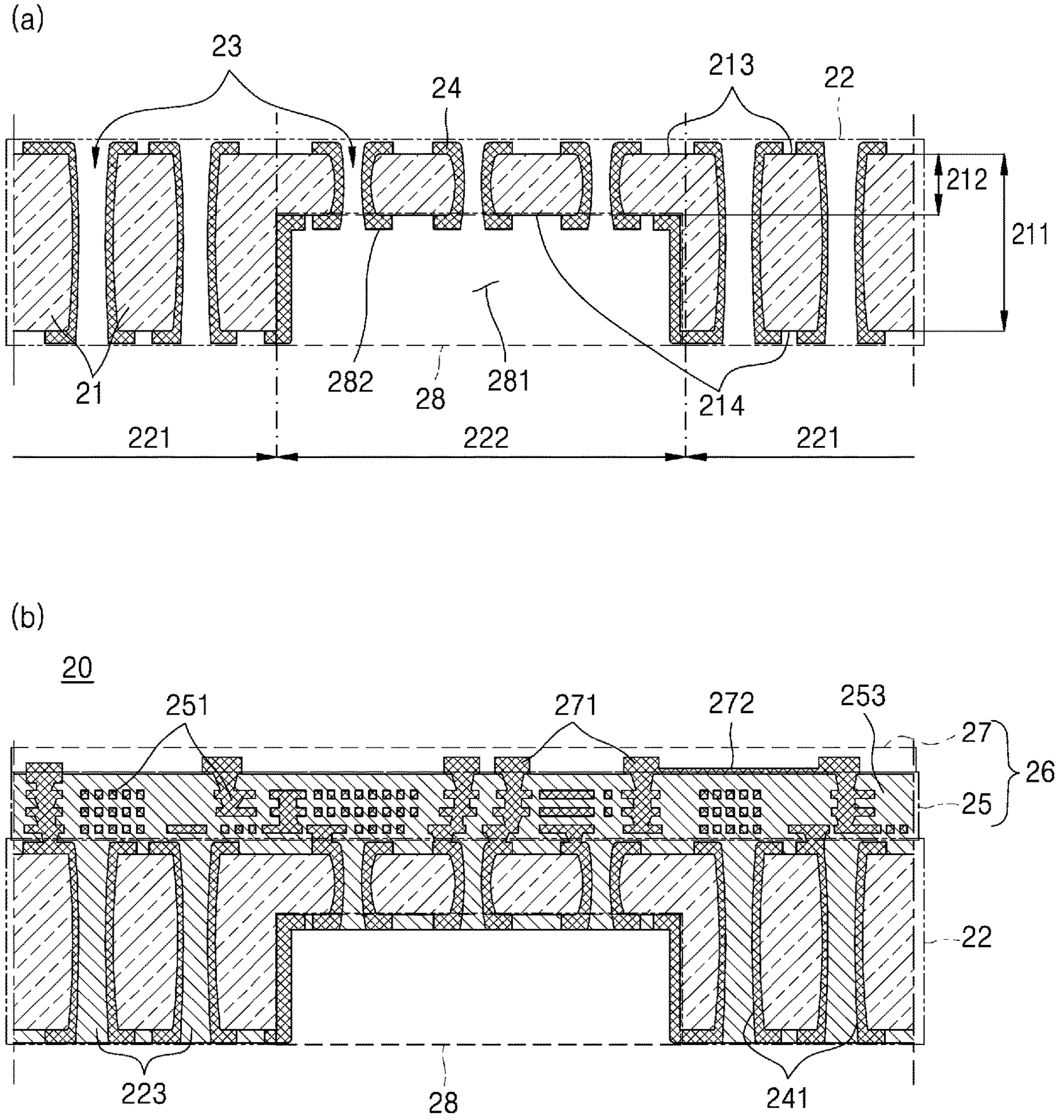
FIGS. 3, (a) and (b) are conceptual diagrams for respectively describing portions of the packaging substrate according to the embodiments in cross-sections.

FIG. 1 is a conceptual diagram for describing a cross-sectional structure of a packaging substrate according to an embodiment, FIG. 2 illustrates a conceptual diagram for describing a cross-sectional structure of a packaging substrate according to another embodiment, and FIGS. 3, (a) and (b) are conceptual diagrams for respectively describing portions of the packaging substrate according to the embodiments in cross-sections.

In order to achieve the above object, a semiconductor device 100 according to the embodiment comprises a semiconductor element portion 30 in which one or more semiconductor elements 32, 34, and 36 are located, a packaging substrate 20 electrically connected to the semiconductor elements, and a motherboard 10 that is electrically connected to the packaging substrate 20, transmits an external electrical signal to the semiconductor elements 32, 34, and 36.

The packaging substrate 20 according to the embodiment comprises a core layer 22, an upper layer 26 located on one surface of the core layer 22, and a cavity portion 28 in which a cavity element 40 may be located.

The semiconductor element portion 30 refers to elements mounted in the semiconductor device, and is mounted on the packaging substrate 20 by a connection electrode or the like. Specifically, as the semiconductor element portion 30, for example, arithmetic elements (a first element 32 and a second element 34) such as a central processing unit (CPU), a graphics processing unit (GPU), and the like, a storage element (a third element 36) such as a memory chip, and the like may be applied, but any semiconductor element mounted in a semiconductor device may be applied without limitation.

A motherboard such as a printed circuit board, a printed wiring board, or the like may be applied as the motherboard 10.

The packaging substrate 20 may selectively further comprise a lower layer (not shown) located under the core layer.

The core layer 22 may comprise a glass substrate 21 including first regions 221 each having a first thickness 211 and a second region 222 adjacent to the first regions 221 and having a second thickness 212 thinner than the first thickness, a plurality of core vias 23 passing through the glass substrate 21 in a thickness direction, and a core distribution layer 24 that is located on a surface of the glass substrate 21 or the core via 23 and electrically connects a first surface 213 of the glass substrate 21 and a second surface 214 facing the first surface 213 through the core vias 23. That is, the core layer 22 may refer to a glass structure, which is the glass substrate 21 including the first surface 213 and the second surface 214 facing each other, the core vias 23, and the cavity portion 28, or all of these.

The second region 222 of the core layer 22 may serve as a cavity structure.

In the same region, the glass substrate 21 has the first surface 213 and the second surface 214 facing each other, and these two surfaces are generally parallel to each other and have uniform thicknesses throughout the glass substrate 21.

An inner space 281 formed by a thickness difference between the first region 221 and the second region 222 serves to accommodate part or all of the cavity element 40.

The glass substrate 21 may comprise the core vias 23 passing through the first surfaces 213 and the second surfaces 214. The core vias 23 may be formed in both the first region 221 and the second region 222, and may be formed with an intended pitch and pattern.

Conventionally, a form in which a silicon substrate and an organic substrate are stacked was applied as a packaging substrate for a semiconductor device. In the case of silicon substrates, there is a concern that parasitic elements are generated when applied to a high-speed circuit due to the nature of semiconductors, and a disadvantage in that power loss is relatively large. Further, in the case of organic substrates, a large area is required to form a more complicated distribution pattern, but this does not conform to the trend of manufacturing miniaturized electronic devices. In order to form a complicated distribution pattern within a predetermined size, pattern miniaturization is substantially required, but there is a practical limit to pattern miniaturization due to the nature of materials such as polymers and the like applied to organic substrates.

In the embodiment, as a method of solving such problems, the glass substrate 21 is applied as a support of the core layer 22. Further, a packaging substrate 20 having a relatively shortened electrical flow, a relatively compact size, a faster response, and less loss characteristics is provided by applying the core vias 23 formed to pass through the glass substrates 21 along with the glass substrate 21.

As the glass substrate 21, a glass substrate applied to a semiconductor may be applied, and for example, a borosilicate glass substrate, an alkali-free glass substrate, or the like may be applied, but the present disclosure is not limited thereto.

The core vias 23 passes through the glass substrate 21. The core vias 23 may be formed by a method of removing predetermined regions of the glass substrate 21, and may be formed by physically and/or chemically etching plate-shaped glass.

Specifically, the formation of the core vias 23 may be performed by chemically etching or laser etching, or the like after forming defects (flaws) on the surface of the glass substrate using a method such as a laser, but the present disclosure is not limited thereto.

The number of core vias 23 located in the glass substrate 21 based on a unit area (1 cm×1 cm) may be 100 to 3000, 100 to 2500, and 225 to 1024. When this pitch condition is satisfied, the formation of an electrically conductive layer and the like and the performance of the packaging substrate may be improved.

The core distribution layer 24 comprises a core distribution pattern 241 which is an electrically conductive layer electrically connecting the first surface and the second surface of the glass substrate through through-vias, and a core insulating layer 223 surrounding the core distribution pattern 241. The core layer 22 may be formed with the electrically conductive layer therein through the core vias to serve as an electrical path crossing the glass substrate 21, and may connect upper and lower portions of the glass substrate with a relatively short distance to have characteristics of faster electrical signal transmission and low loss. For example, a copper-plated layer may be applied as the electrically conductive layer, but the present disclosure is not limited thereto.

The shape of the cavity portion 28 is substantially not limited to a shape such as a circular shape, a triangular shape, a quadrangular shape, a hexagonal shape, an octagonal shape, a cross shape, and the like.

The shape of the cavity element 40 may generally be a cylindrical shape, rectangular parallelepiped shape, or a polygonal pillar shape.

The cavity portion 28 may comprise a cavity distribution pattern, which is an electrically conductive layer electrically connecting the cavity element 40 and the core distribution layer 24, and an insulating layer which surrounds the cavity distribution pattern.

Meanwhile, a cavity portion according to another embodiment may be implemented in the form of passing through the first surface 213 and the second surface 214 of the glass substrate 21. In this case, the cavity portion may be formed according to the same process as a process of forming the core via 23, and the area and shape passing through the glass substrate 21 may be different from those of the core via 23.

In this embodiment, after the cavity element 40 is arranged in the cavity portion, an insulating layer may be formed. That is, the insulating layer may also be generated in the cavity portion through a process of generating the above-described core insulating layer 223.

The core distribution pattern 241 may be formed to be electrically connected to the cavity element 40.

The cavity element 40 may comprise an active element such as a transistor or a power transmission element such as a multilayer ceramic capacitor (MLCC), that is, a passive element.

When an element such as a transistor serving to convert an electrical signal between a motherboard and a semiconductor element portion to an appropriate level is applied as the cavity element 40, since a transistor or the like is applied to the path of the packaging substrate 20, a more efficient and faster semiconductor device 100 may be provided.

Further, a power transmission element such as a multilayer ceramic capacitor (MLCC) plays an important role in the performance of a semiconductor element. Generally, at least 200 or more power transmission elements, which are passive elements, are applied to a semiconductor element, and performance thereof is also affected by the characteristics of an electrically conductive layer around the element in power transmission. In one embodiment, a core via having a non-circular shape rather than a circular shape may be applied to a place where a low-resistance electrically conductive layer is required, such as a power transmission element.

Meanwhile, a passive element such as a capacitor or the like may be individually inserted into and applied to the cavity element 40, and an element group including a plurality of passive elements in the form of being embedded between insulator layers (cavity element insulating layers) may be formed such that electrodes are exposed, and then inserted into the cavity element. In the latter case, the workability of manufacturing the packaging substrate may become smoother, and there is a relative advantage in that the insulating layer is sufficiently and reliably located in a space between complicated elements.

The glass substrate 21 serves as an intermediate and intermediary, which connect the semiconductor element portion 30 and the motherboard 10 at an upper portion and a lower portion, respectively, and the core vias 23 serve as paths through which the electrical signals thereof are transmitted, and thus smoothly transmit the signals.

The upper layer 26 is located on the first surface 213.

The upper layer 26 comprises an upper distribution layer 25 and an upper surface connection layer 27 located on the upper distribution layer 25, and the uppermost surface of the upper layer 26 may be protected by a cover layer 60 formed with an opening that may come into direct contact with the connection electrode of the semiconductor element portion.

The upper distribution layer 25 comprises an upper insulating layer 253 located on the first surface, and an upper distribution pattern 251 embedded in the upper insulating layer 253 as an electrically conductive layer having a predetermined pattern and to which the core distribution layer 24 is at least partially connected.

Any one which is applied as an insulator layer in a semiconductor element or a packaging substrate may be applied as the upper insulating layer 253, for example, an epoxy-based resin or the like including a filler may be applied, but the present disclosure is not limited thereto.

The insulator layer may be formed by a method of forming and curing a coating layer, and may also be formed by a method of laminating an insulator film formed to be a film in an uncured or semi-cured state on the core layer 22 and curing the insulator film. In this case, when a pressure sensitive lamination method or the like is applied, since the insulator is incorporated into a space in the core via 23, an efficient process may be performed.

According to one embodiment, even when multi-layer insulator layers are stacked and applied, it may become difficult to substantially distinguish the insulator layers, and a plurality of insulator layers are collectively called an upper insulation layer. Further, the same insulating material may be applied to the core insulating layer 223 and the upper insulating layer 253, and in this case, a boundary thereof may not be substantially distinguished. Alternatively, according to another embodiment, the boundary of the insulator layers may be generated by setting the pressure and temperature for curing the multi-layer insulator layers differently.

The upper distribution pattern 251 refers to an electrically conductive layer located in the upper insulating layer 253 in a preset form, and may be formed, for example, using a build-up layer method. Specifically, the upper distribution pattern 251 formed with an electrically conductive layer in a vertical direction or horizontal direction in an intended pattern may be formed by repeating a method of forming an insulator layer, removing unnecessary portions of the insulator layer, forming an electrically conductive layer by a method of copper plating or the like, selectively removing unnecessary portions of the electrically conductive layer, forming another insulator layer on the electrically conductive layer, removing the unnecessary portions again, and then forming an electrically conductive layer by a plating method or the like.

The upper distribution pattern 251 is located between the core layer 22 and the semiconductor element portion 30, and thus is formed to include a micro pattern in at least a portion thereof so that transmission of the electrical signals with the semiconductor element portion 30 may be smoothly performed and an intended complicated pattern may be sufficiently accommodated. In this case, each of a width and an interval of the micro pattern may be smaller than 4 μm, 3.5 μm or less, 3 μm or less, and 2.5 μm or less, and may be 1 to 2.3 μm (hereinafter, descriptions for the micro pattern are the same).

At least a portion of the upper surface connection layer 27 is electrically connected to the upper distribution pattern 251, and the upper surface connection layer 27 comprises an upper surface connection pattern 272 located on the upper insulating layer 253 and an upper surface connection electrode 271, which electrically connects the semiconductor element portion 30 and the upper surface connection pattern 272. The upper surface connection pattern 272 may be located on one surface of the upper insulating layer 253, and may be embedded in the upper insulating layer while at least a portion of the upper surface connection pattern 272 may be exposed on the upper insulating layer. For example, when the upper surface connection pattern is located on one surface of the upper insulating layer, the upper insulating layer may be formed by a plating method or the like, and a case in which the upper surface connection pattern is embedded in the upper insulating layer while the portion of the upper surface connection pattern is exposed on the upper insulating layer may be a case in which a portion of the insulating layer or electrically conductive layer is removed by a method such as surface polishing, surface etching, or the like after a copper-plated layer or the like is formed.

At least a portion of the upper surface connection pattern 272 may comprise a micro pattern like the above-described upper distribution pattern 251. The upper surface connection pattern 272 including the micro pattern allows a relatively larger number of elements to be connected even in a small area to make an electrical signal connection between the elements or with the outside smooth, and more integrated packaging is possible.

The upper surface connection electrode 271 may be directly connected to the semiconductor element portion 30 through a terminal or the like, and may also be connected to the semiconductor element portion 30 through an element connection portion 51 such as a solder ball.

The cavity portion 28 is located on and/or under the second region 222 and comprises a cavity distribution layer 282 electrically connected to the core distribution pattern 241 and the inner space 281 in which the cavity element 40 is located.

Specifically, the thickness of the glass substrate 21 in the second region 222 is thinner than the thickness of the glass substrate 21 in the first region 221, and the cavity element 40 may be located in the inner space 281 formed due to the thickness difference. Further, the core vias 23 and the core distribution layer 24 formed in the glass substrate 21 serve as an electrical connection structure connecting the cavity element 40 and external elements.

Further, as described above, in the second region 222 other than the first region 221, that is, a cavity portion in the form of passing through the first surface 213 and the second surface 214 of the glass substrate 21 may be generated, and the cavity element 40 may be arranged in the cavity portion.

The packaging substrate 20 is also connected to the motherboard 10. A terminal of the motherboard 10 may be directly connected to the core distribution pattern 241 located on at least a portion of the second surface 214 of the core layer 22, and the motherboard 10 may be electrically connected to the core distribution pattern 241 through a board connection portion 52 such as a solder ball. Further, the core distribution pattern 241, which comes into contact with the motherboard 10, may be connected to the motherboard 10 through a lower layer (not shown) located under the core layer 22.

According to an example, other additional substrates other than the glass substrate 21 may not be substantially applied to the packaging substrate 20 located between the semiconductor element portion 30 and the motherboard 10.

Conventionally, an interposer and an organic substrate were stacked together and applied between the element and the motherboard while connecting the element and the motherboard because a multi-stage form is applied for at least two reasons: one is that there is a scale problem in directly bonding a micro pattern of the element to the motherboard; and the other is that a problem of wiring damage due to a difference in thermal expansion coefficient may occur during a bonding process or a process of driving the semiconductor device. In the embodiment, this problem was solved by applying a glass substrate having a thermal expansion coefficient similar to that of a semiconductor element, and forming a micro pattern having a sufficiently fine scale for mounting the element on the first surface and an upper layer of the glass substrate.

Hereinafter, a packaging substrate manufacturing method according to the embodiment of the present disclosure will be described.

Figure 4:
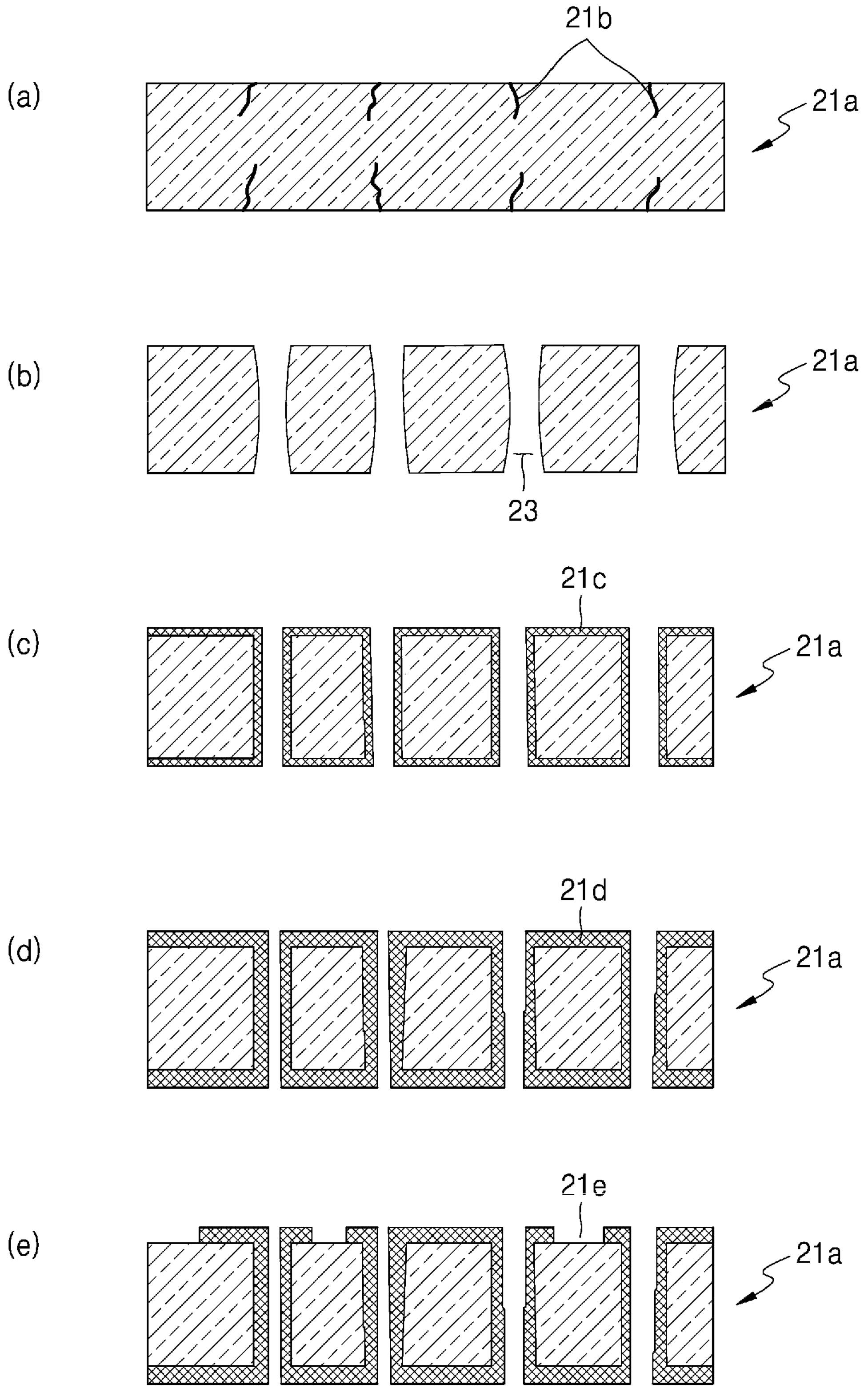
FIG. 4 is a flow chart for describing a process of generating a core distribution layer in a packaging substrate manufacturing process according to the embodiment in cross-sections.
Figure 5:
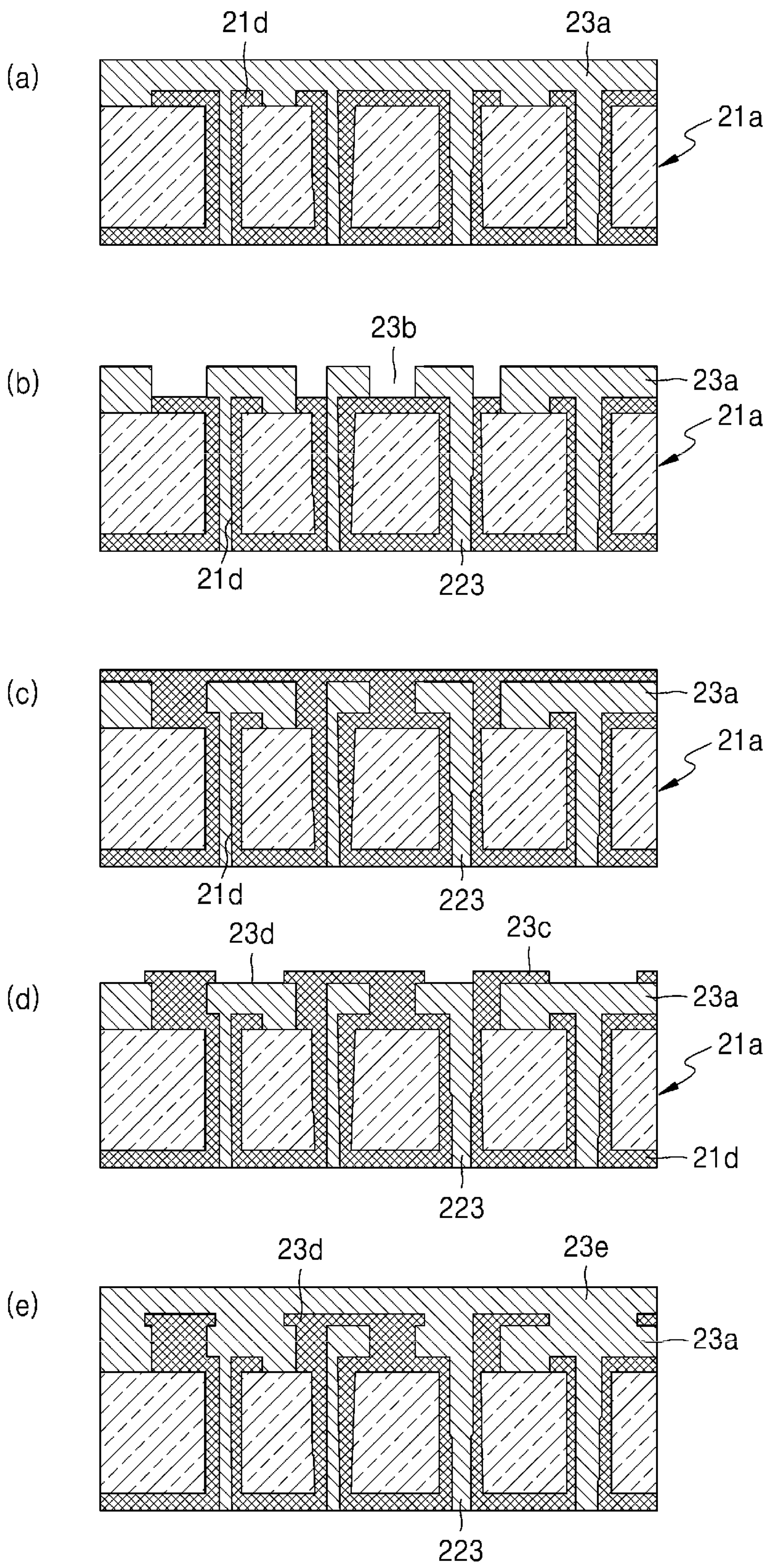
FIG. 5 is a flow chart for describing a process of generating an insulating layer in the packaging substrate manufacturing process according to the embodiment in cross-sections FIGS. 6, (a) to (c) are views for describing portions of the packaging substrates according to the embodiments in cross-sections.

FIGS. 4 and 5 are flow charts for describing the packaging substrate manufacturing process according to the embodiment in cross-sections.

First, as shown in FIG. 4, (a), a glass substrate 21*a* having flat first and second surfaces is prepared, and defects (flaws) 21*b* are formed at predetermined positions in a glass surface to form core vias. A glass substrate applied to a substrate of an electronic device or the like may be applied as the glass substrate, for example, an alkali-free glass substrate may be applied as the glass substrate, but the present disclosure is not limited thereto. As commercially available products, products manufactured by manufacturers such as Corning, Schott, AGC, and the like may be applied. A method such as mechanical etching, laser irradiation, or the like may be applied to the formation of the defects (flaws).

As shown in FIG. 4, (b), in the glass substrate 21*a* having the defects (flaws) 21*b*, an etching operation of forming the core vias 23 through a physical or chemical etching process is performed. During the etching process, the vias are formed in defective portions of the glass substrate, and the surface of the glass substrate 21*a* may also be etched. In order to prevent etching of the glass surface, a masking film or the like may be applied, but considering the inconvenience of applying and removing the masking film, the defective glass substrate itself may be etched, and in this case, the thickness of the glass substrate having the core vias may be somewhat thinner than the initial thickness of the glass substrate.

Thereafter, as shown in FIGS. 4, (c) and (d), a core layer manufacturing operation may be performed by forming an electrically conductive layer 21*d* on the glass substrate. A metal layer including copper metal may be representatively applied as the electrically conductive layer, but the present disclosure is not limited thereto.

Since the surface of the glass (including the surface of the glass substrate and a surface of the core via) and the surface of the copper metal have different properties, adhesion is low. In the embodiment, the adhesion between the glass surface and the metal may be improved by two methods such as a dry method and a wet method.

The dry method is a method of applying sputtering, that is, a method of forming a seed layer 21*c* on the glass surface and an inner diameter of the core via through metal sputtering. Dissimilar metals such as titanium, chromium, and nickel may be sputtered together with copper to form the seed layer, and in this case, a glass-metal adhesion may be improved by an anchor effect, in which metal particles interact with the surface morphology of the glass, or the like.

The wet method is a method of performing primer treatment, and is a method of forming a primer layer 21*c* by performing pre-treatment with a compound having a functional group such as an amine. The primer treatment may be performed with a compound or particles having an amine functional group after performing pre-treatment with a silane coupling agent according to the degree of intended adhesion.

As mentioned above, a support substrate of the embodiment needs to have to have high enough performance to form a micro pattern, and this should be maintained even after primer treatment. Accordingly, when such a primer includes nanoparticles, nanoparticles having an average diameter of 150 nm or less may be applied, for example, nanoparticles having an amine group may be applied. The primer layer may be, for example, formed by applying a bonding strength improving agent, e.g., the CZ series manufactured by MEC or the like.

In the seed layer/primer layer 21*c*, the electrically conductive layer may selectively form the metal layer in a state in which unnecessary portions for the formation of the electrically conductive layer are removed or not removed. Further, in the seed layer/primer layer 21*c*, portions required or not required for the formation of the electrically conductive layer in an activated or deactivated state may be treated selectively with metal plating to perform subsequent processes. For example, light irradiation treatment such as a laser of a certain wavelength or the like, chemical treatment, or the like may be applied to the activation or deactivation treatment. A copper plating method or the like applied to semiconductor element manufacturing may be applied to the formation of the metal layer, but the present disclosure is not limited thereto.

As shown in FIG. 4, (e), a portion of the core distribution layer may be removed when unnecessary, and after a portion of the seed layer is removed or deactivated, metal plating may be performed to form an electrically conductive layer in a predetermined pattern, and then form an etching layer 21*e* of the core distribution layer.

FIG. 5 describes a manufacturing operation of forming an insulating layer and an upper distribution pattern according to one embodiment.

As shown in FIG. 5, (a), the core via may go through an insulating layer forming operation of filling an empty space with an insulating layer after forming the core distribution layer which is the electrically conductive layer. In this case, an insulating layer manufactured in the form of a film may be applied as the insulating layer to be applied, and for example, a pressure sensitive lamination method of the insulating layer in the form of a film, or the like may be applied. When the pressure sensitive lamination is performed like in this way, the insulating layer is sufficiently incorporated into the empty space in the core via to form a core insulating layer in which a void is not formed.

FIGS. 5, (b) to (e) describe an upper layer manufacturing operation.

The upper layer manufacturing operation is an operation of forming an upper distribution layer including an upper insulating layer and an upper distribution pattern on the core layer. The upper insulating layer may be formed by a method of coating a resin composition forming an insulating layer 23*a* or laminating insulating films, and for convenience, the method of laminating the insulating films is better. The laminating of the insulating films may be performed by a process of laminating and curing the insulating films, and in this case, when the pressure sensitive lamination method is applied, an insulating resin may be sufficiently incorporated even into a layer in which the electrically conductive layer is not formed in the core via or the like. An upper insulating layer which comes into direct contact with at least a portion of the glass substrate, and thus has sufficient adhesion is applied as the upper insulating layer. Specifically, the glass substrate and the upper insulating layer may have characteristics in which adhesion test values according to ASTM D3359 satisfy 4B or more.

The upper distribution pattern may be formed by repeating the process of forming an insulating layer 23*a*, and forming an electrically conductive layer 23*c* in a predetermined pattern and etching unnecessary portions to form an etching layer 23*d* of the electrically conductive layer, and electrically conductive layers formed adjacent to each other with the insulating layer therebetween may be formed by a method of performing a plating process after forming a blind via 23*b* in the insulating layer. A dry etching method such as laser etching, plasma etching, or the like, a wet etching method using a masking layer and an etchant, or the like may be applied to the formation of the blind via.

Hereinafter, although not shown in the drawings, an upper surface connection layer and a cover layer may be formed.

The upper surface connection pattern and the upper surface connection electrode may also be formed in a process similar to forming the upper distribution layer. Specifically, the upper surface connection pattern and the upper surface connection electrode may be formed by a method of forming an etching layer of the insulating layer on an insulating layer 23*e*, forming an electrically conductive layer thereon, and then forming an etching layer of the electrically conductive layer, or the like, but a method of selectively forming only the electrically conductive layer without applying an etching method may also be applied. The cover layer may be formed so that an opening (not shown) may be formed at a position corresponding to the upper surface connection electrode and thus the upper surface connection electrode is exposed, and the cover layer may be directly connected to an element connection portion, a terminal of an element, or the like.

When the upper layer is generated, a process for the lower layer may be performed by forming a lower connection layer and the cover layer. A lower distribution layer and/or the lower connection layer, and selectively, the cover layer (not shown) may be formed in a manner similar to the above-described operation of forming the upper surface connection layer and cover layer.

According to the embodiment, when a plurality of elements are mounted on the glass substrate 21, cavity portions 29*a* and 29*b* having different heights may be generated in consideration of the design of the elements (that is, positions where the elements are arranged or areas or heights of the elements).

Figure 6:
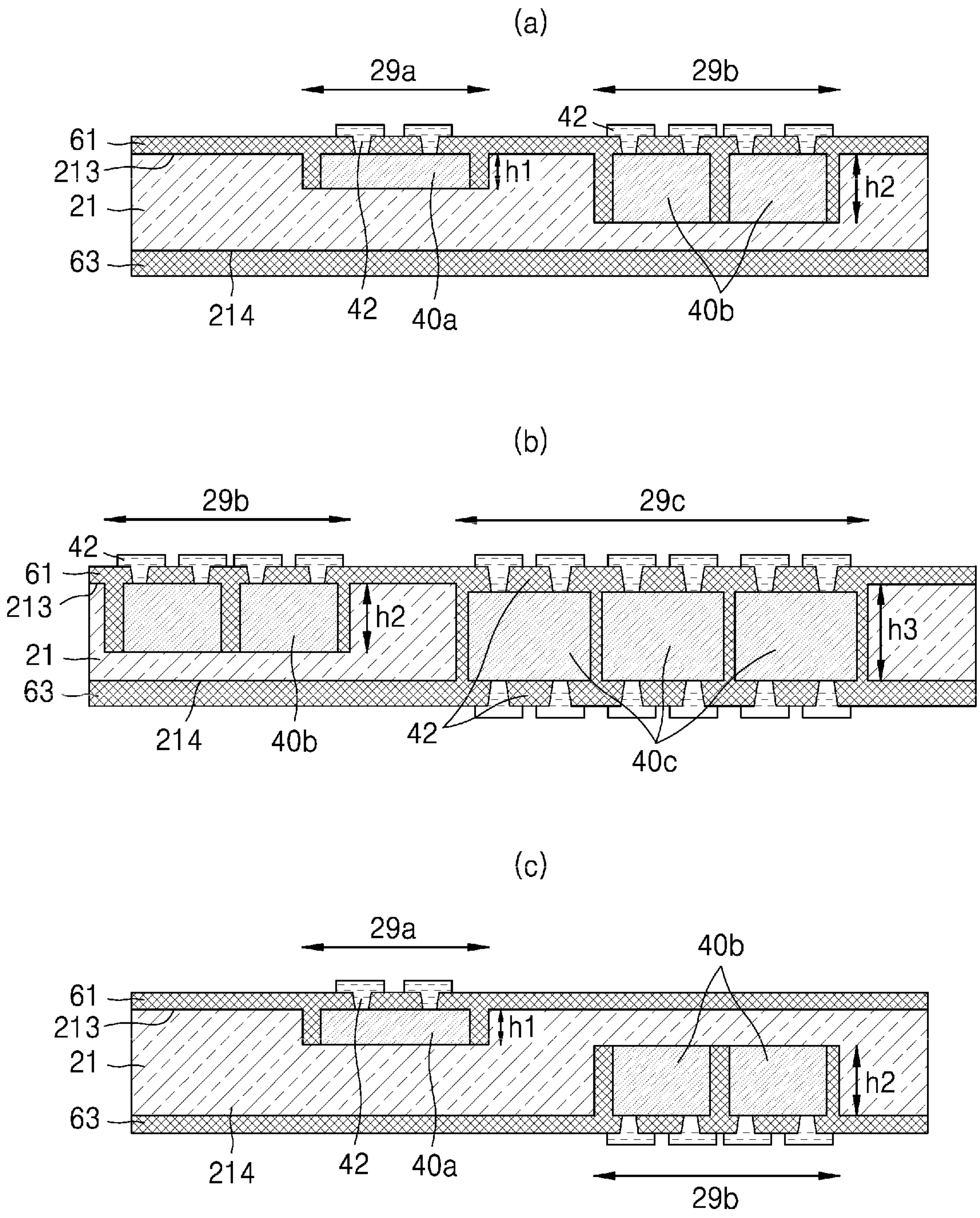

FIGS. 6, (a) to (c) are views for describing portions of the packaging substrates according to the embodiments in cross-sections.

As shown in FIG. 6, (a), a first cavity portion 29*a* having a first depth h1 and a second cavity portion 29*b* having a second depth h2 may be formed in the glass substrate 21. Both the first cavity portion 29*a* and the second cavity portion 29*b* may be open and recessed in a direction toward the first surface 213.

The second depth h2 may be deeper than the first depth h1. A cavity element portion having a height corresponding to a depth of a first cavity portion 29*a* may be disposed at the first cavity portion 29*a*, and cavity element portion having a height corresponding to a depth of a second cavity portion 29*b* may be disposed at the second cavity portion 29*b*. The cavity element portion may comprise the one in which one or two or more cavity elements 40*a* and 40*b* are arranged. The cavity element portion may be that each of cavity elements is molded one after arranged. Or the cavity element portion may be arranged one that each cavity elements are molded.

Although the cavity element portion of the first cavity portion 29*a* and the cavity element portion of the second cavity portion 29*b* have different heights, an upper insulating layer 61 formed on the first cavity portion 29*a* and the second cavity portion 29*b* may be formed substantially flat without curving.

Further, although the heights of the first cavity element 40*a* and the second cavity element 40*b* are different, the upper insulating layer 61 formed on the first cavity element 40*a* and the second cavity element 40*b* may be formed substantially flat without curving.

The insulating layer may be formed by pressure sensitive lamination of an insulating film for a semiconductor such as an Ajinomoto Build-up Film (ABF).

Due to the characteristics of the insulating film manufactured in a predetermined film shape, a deep and wide space causes a surface imbalance in a process of forming the insulating layer, and specifically, in the case of a cavity requiring the formation of an insulating layer in a space wider than a normal via, the degree of undulation may be severe.

The embodiment is intended to solve this problem by forming the depths of the cavity portions to be different so that the depths correspond to depths of the cavity elements.

A portion of the upper insulating layer 61 is incorporated into the first cavity portion 29*a* and the second cavity portion 29*b*, and a surface of the upper insulating layer 61 may be stacked substantially flat on the first surface 213. Since the depths of the first cavity portion 29*a* and the second cavity portion 29*b* are formed to be different, the first surface 213 of the glass substrate 21 may be relatively flat.

A lower insulating layer 63 may also be formed on the second surface 214 of the glass substrate 21, that is, under the glass substrate 21.

Meanwhile, one or more connection electrodes 42 may be disposed on the first cavity element 40*a* in the direction toward the first surface 213, and one or more connection electrodes 42 may be disposed on the second cavity element 40*b* in the direction toward the first surface 213.

The connection electrodes 42 are arranged or formed on the first surface 213 in a direction in which the first cavity portion 29*a* and the second cavity portion 29*b* are open, and may be electrically connected to an upper layer (not shown), which may be formed on the glass substrate 21.

The connection electrodes 42 may be formed as part of the electrodes of the first cavity element 40*a* and the second cavity element 40*b*, may be formed as distribution electrodes of the upper layer or connected to the distribution electrodes, or may be configured in the form including both of the above.

Meanwhile, according to another embodiment, the first cavity portion 29*a* and the second cavity portion 29*b* may be open and recessed in the direction toward the second surface 214 of the glass substrate 21 instead of the first surface 213. In this case, the connection electrodes may be disposed or formed to come into contact with the first cavity portion 29*a* and the second cavity portion 29*b* in the direction toward the second surface 214. That is, a technical feature according to the present disclosure is intended to generate cavity portions having different depths in the glass substrate 21, and the shape of the opening of cavity portion is irrelevant.

Further, the first surface 213 and the second surface 214 of the glass substrate 21 refer to two surfaces facing each other, and are not limited to any specific surfaces. A case in which the cavity portions are open and recessed toward the first surface may be interpreted as a case in which the cavity portions are open toward any one surface of the two facing surfaces of the glass substrate 21.

According to another embodiment, as shown in FIG. 6, (b), the core layer may comprise the second cavity portion 29*b* open and recessed in the direction toward the first surface 213 and having the second depth, and a third cavity portion 29*c* having a third depth h3 passing through the first surface 213 and the second surface 214 of the glass substrate 21. The third depth h3 is the same as the height of the glass substrate 21 and is deeper than the second depth h2 of the second cavity portion 29*b* recessed in only one direction.

That is, according to another embodiment, some of the cavity portions having different depths may be open in one direction of the glass substrate 21, and some of the cavity portions may be formed through the glass substrate 21.

In a third cavity element 40*c* mounted in the third cavity portion 29*c* passing through the glass substrate 21, the connection electrodes 42 may be disposed or formed on both the upper surface facing the first surface 213 and a bottom surface facing the second surface 214. That is, in the case of the third cavity element 40*c* passing through the glass substrate 21, one or more connection electrodes may be further disposed in a direction (on the second surface 214) opposite the connection electrodes formed on the first surface 213 with the third cavity element 40*c* therebetween.

As described above, the connection electrodes 42 may be electrically connected to the upper layer to supply power to a semiconductor chip, and may be electrically connected to the lower layer to be connected to the motherboard.

According to still another embodiment, as shown in FIG. 6, (c), the opening directions of a plurality of half cavities open and recessed in one direction in the glass substrate 21 may be different from each other. For example, the first cavity portion 29*a* may be open toward the first surface 213 and the second cavity portion 29*b* may be open toward the second surface 214.

As shown in the drawings, the first depth h1 of the first cavity portion 29*a* and the second depth h2 of the second cavity portion 29*b* may be different from each other, and according to an example, the second depth h2 may be deeper than the first depth h1. Of course, the first depth h1 may be deeper than the second depth h2.

In the embodiment, the connection electrodes 42, which come into contact with the first cavity element 40*a*, may be electrically connected to the upper layer, and the connection electrodes 42, which come into contact with the second cavity element 40*b*, may be electrically connected to the lower layer.

The role of the cavity elements mounted in the packaging substrate may be changed according to the design of the semiconductor element or motherboard connected to the upper layer or lower layer, and an opening direction of the cavity portions may be changed according to the role of these cavity elements. The arrangement of the connection electrodes may also be changed according to the opening direction of the cavity portions.

In summarization of the shape of the cavity portion in FIG. 6, in the glass substrate 21, the first cavity portion 29*a* open and recessed in the direction toward the first surface 213 or second surface 214 and having the first depth h1 may be formed, and the second cavity portion 29*b* having the second depth h2 different from the first depth h1 may be formed to be open in the direction toward the first surface 213 or second surface 214.

As described above, each of the cavity elements 40*a*, 40*b*, and 40*c* may independently be a passive element such as an MLCC or an active element such as a diode. Such various elements have different sizes, areas, or heights, and in this case, may cause undulation when a re-distribution layer (RDL) is formed.

Accordingly, according to the embodiment, when a plurality of elements are mounted on the glass substrate 21, cavity portions 29*a* and 29*b* or 29*b* and 29*c* having different heights may be generated in consideration of the design of the elements (that is, the positions where the elements are arranged, the areas or heights of the elements).

To this end, a packaging substrate having cavity portions having different heights may be manufactured by repeating a method of selectively etching after masking when the cavity portions 29*a* and 29*b* or 29*b* and 29*c* are formed. However, there is a disadvantage in that the formation and removal of the masking on the surface of the glass substrate 21 should be repeatedly performed, resulting in a complicated manufacturing process.

In another method, a packaging substrate may be manufactured by selectively irradiating laser of different intensities or adjusting a laser irradiation time when the cavity portions 29*a* and 29*b* or 29*b* and 29*c* are formed, and etching the glass substrate 21 in which the cavity portions are formed. This etching might be performed in once. That is, the degree of defects formed in the substrate may be changed according to an amount of the laser irradiation, and through this process, a plurality of half cavities or full cavities having different heights may be formed. Accordingly, the problem of undulation caused by the different heights of elements when various types of elements are mounted may be alleviated or eliminated.

Figure 7:
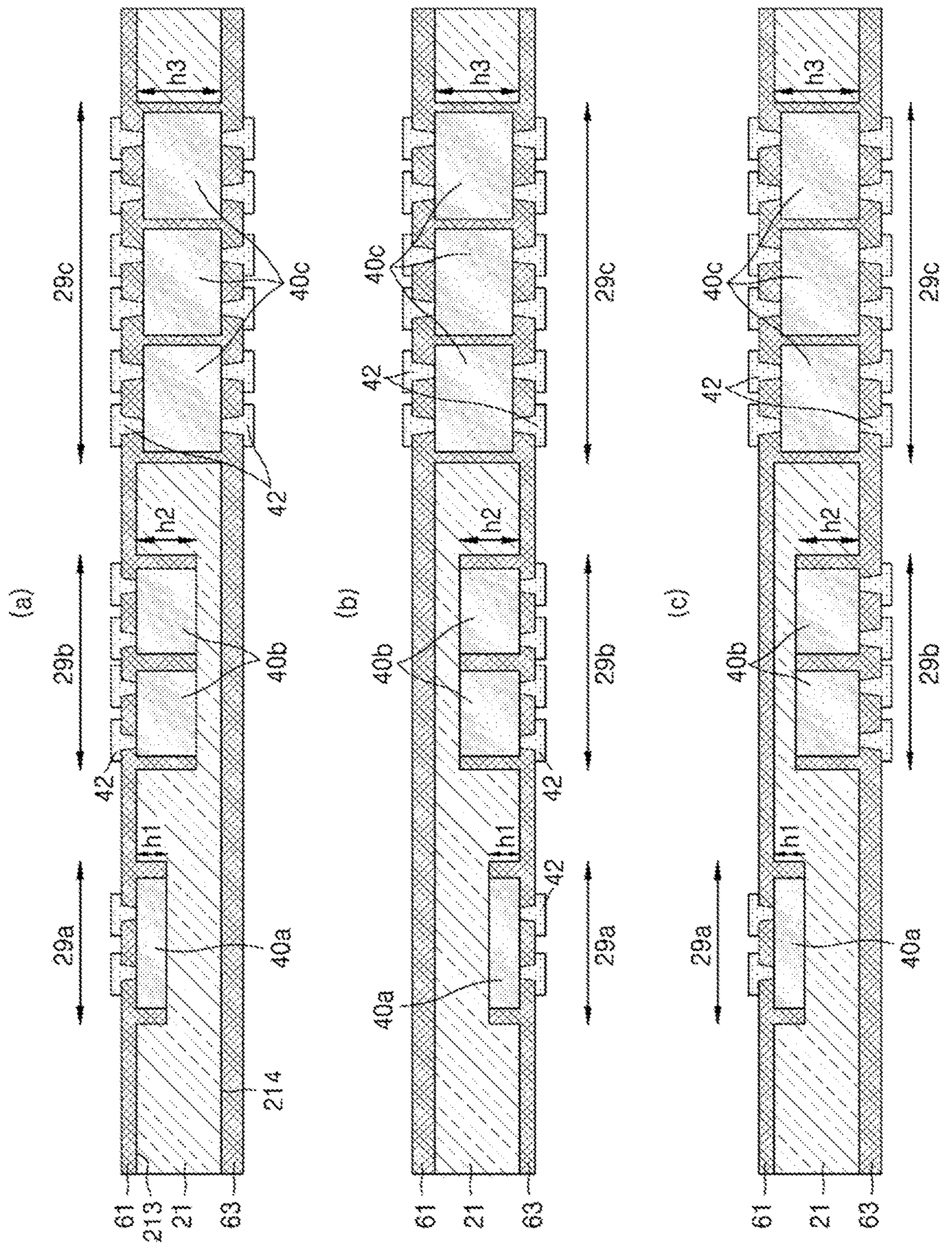
FIGS. 7, (a) to (c) are views for describing portions of packaging substrates according to still another embodiment in cross-sections.

FIGS. 7, (a) to (c) are views for describing portions of the packaging substrates according to still another embodiment in cross-sections.

As shown in FIG. 7, (a), a first cavity portion 29*a* having a first depth h1, a second cavity portion 29*b* having a second depth h2, and a third cavity portion 29*c* having a third depth h3 may be formed in a glass substrate 21. The first cavity portion 29*a* and the second cavity portion 29*b* may be open and recessed in a direction toward a first surface 213, and the third cavity portion 29*c* may pass through the glass substrate 21.

The second depth h2 is deeper than the first depth h1, and the third depth h3 is deeper than the second depth h2. Cavity element portions having heights respectively corresponding to the depths of the first cavity portion 29*a*, the second cavity portion 29*b*, and the third cavity portion 29*c* may be disposed in the first cavity portion 29*a*, the second cavity portion 29*b*, and the third cavity portion 29*c*.

A cavity element portion of the first cavity portion 29*a*, a cavity element portion of the second cavity portion 29*b*, and a cavity element portion of the third cavity portion 29*c* have different heights, but an upper insulating layer 61 formed on the first cavity portion 29*a*, the second cavity portion 29*b*, and the third cavity portion 29*c* may be formed substantially flat without curving.

Cavity elements 40*a*, 40*b*, and 40*c* having heights respectively corresponding to the depths of the first cavity portion 29*a*, the second cavity portion 29*b*, and the third cavity portion 29*c* may be disposed in the first cavity portion 29*a*, the second cavity portion 29*b*, and the third cavity portion 29*c*.

As shown in the drawings, the first cavity element 40*a*, the second cavity element 40*b*, and the third cavity portion 29*c* have different heights, but an upper insulating layer 61 formed on the first cavity element 40*a*, the second cavity element 40*b*, and the third cavity portion 29*c* may be formed substantially flat without curving.

A portion of the upper insulating layer 61 is incorporated into the first cavity portion 29*a*, the second cavity portion 29*b*, and the third cavity portion 29*c*, and a surface of the upper insulating layer 61 may be stacked substantially flat on the first surface 213. Selectively, the lower insulating layer 63 may also be formed on the second surface 214 of the glass substrate 21, that is, under the glass substrate 21.

A core layer in FIG. 7 may also comprise one or more connection electrodes 42 disposed on the first cavity element 40*a* in the direction toward the first surface 213, one or more connection electrodes 42 disposed on the second cavity element 40*b* in the direction toward the first surface 213, and one or more connection electrodes 42 disposed on the third cavity element 40*c* in the direction toward the first surface 213.

The connection electrodes 42 are arranged or formed on the first surface 213 in a direction in which the first cavity portion 29*a*, the second cavity portion 29*b*, and the third cavity portion 29*c* are open, and may be electrically connected to an upper layer (not shown) which may be formed on the glass substrate 21.

Additionally, in the third cavity element 40*c* mounted in the third cavity portion 29*c* passing through the glass substrate 21, the connection electrodes 42 may be disposed or formed on both the upper surface facing the first surface 213 and a bottom surface facing the second surface 214. That is, in the case of the third cavity element 40*c* passing through the glass substrate 21, one or more connection electrodes may be further disposed in a direction (on the second surface 214) opposite the connection electrodes formed on the first surface 213 with the third cavity element 40*c* therebetween.

The connection electrodes 42 may be formed as part of the electrodes of the first cavity element 40*a*, the second cavity element 40*b*, and the third cavity element 40*c*, or may be formed as distribution electrodes of the upper layer, or may be configured in the form including both of the above.

The core layer according to the embodiment in FIG. 7, (b) comprises the cavity portions 29*a*, 29*b*, and 29*c* open and recessed in a direction toward the second surface 214 of the glass substrate 21, that is, the bottom surface of the glass substrate 21.

In this case, the connection electrodes 42 may be disposed or formed on bottom surfaces of the first cavity element 40*a*, the second cavity element 40*b*, and the third cavity element 40*c*. The connection electrodes 42 facing the bottom surfaces may be electrically connected to a motherboard (not shown) through a lower layer formed under the core layer.

According to still another embodiment, as shown in FIG. 7, (c), the opening directions of a plurality of half cavities open and recessed in one direction in the glass substrate 21 may be different from each other. For example, the first cavity portion 29*a* may be open toward the first surface 213 and the second cavity portion 29*b* may be open toward the second surface 214. As shown in the drawings, the first depth h1 of the first cavity portion 29*a* and the second depth h2 of the second cavity portion 29*b* may be different from each other, and according to an example, the second depth h2 may be deeper than the first depth h1. Of course, the first depth h1 may be deeper than the second depth h2.

As described above, the connection electrodes 42, which come into contact with the first cavity element 40*a*, may be electrically connected to the upper layer, and the connection electrodes 42, which come into contact with the second cavity element 40*b*, may be electrically connected to the lower layer.

The role of the cavity elements mounted in the packaging substrate may be changed according to the design of the semiconductor element or motherboard connected to the upper layer or lower layer, and an opening direction of the cavity portions may be changed according to the role of these cavity elements. The arrangement of the connection electrodes may also be changed according to the opening direction of the cavity portions.

In summarization of the shape of the cavity portion in FIG. 7, in the glass substrate 21, the first cavity portion 29*a* open and recessed in the direction toward the first surface 213 or second surface 214 and having the first depth h1 may be formed, the second cavity portion 29*b* having the second depth h2 different from the first depth h1 may be formed to be open in the direction toward the first surface 213 or second surface 214, and the third cavity portion 29*c* passing through the first surface 213 and the second surface 214 may be formed.

Figure 8:
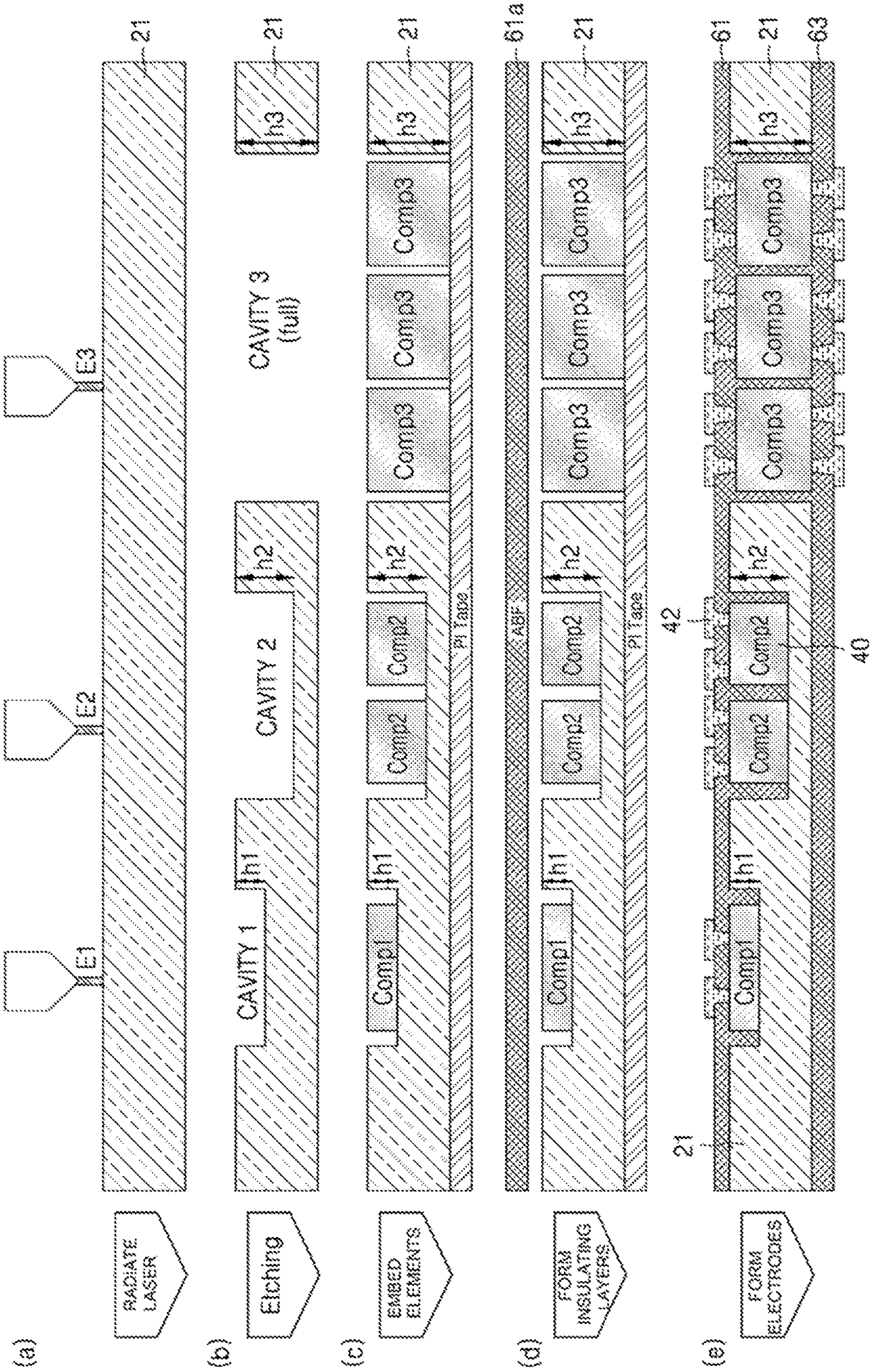
FIG. 8 is a flow chart for describing the packaging substrate manufacturing process according to the embodiment in cross-sections.

FIG. 8 is a flow chart for describing the packaging substrate manufacturing process according to the embodiment in cross-sections. A process of mounting the cavity elements and forming the core layer in the packaging substrate will be specifically viewed through FIG. 8 as follows. For example, the manufacturing process will be described with respect to a case of manufacturing a packaging substrate having three cavity portions, but the number of cavity portions or a direction of openings is not limited.

First, as shown in FIG. 8, (a), defects (or flaws) are formed on the surface of the glass substrate 21. A method such as mechanical etching, laser irradiation, or the like may be applied to form the defects (or flaws), and the defects may be generated by irradiating laser as shown in the drawing.

In this case, the size of the defect, such as the width or depth, or the degree of defects may be changed according to the depth of the cavity portion. An etching rate may be fast when an intensity of defect formation is high, an etching degree may be slow when a range or the intensity of the defect formation is low, and cavity portions having different depths may be manufactured by adjusting the etching rate.

Further, the etching degree may be adjusted by partially applying masking as necessary.

The size of the cavity portion may be determined to correspond to an element to be mounted in the cavity portion. That is, the degree of defects may be controlled according to the height or area of the cavity element.

When the defect is formed, as shown in FIG. 8, (b), an etching operation of forming cavity portions CAVITY 1, CAVITY 2, and CAVITY 3 may be performed through a physical or chemical etching process. In etching of the cavity portions, cavity portions having different depths may be simultaneously formed by a method of immersing in an etching solution.

As shown in the drawing, a depth h1 of CAVITY 1 may be shallower than a depth h2 of CAVITY 2, and CAVITY 3 may be a full CAVITY, and may have a depth h3 the same as the height of the glass substrate 21.

Further, the area or width of CAVITY 2 may be greater than that of CAVITY 1, and the area or width of CAVITY 3 may be greater than that of CAVITY 2. The degree of defects and the etching degree may be adjusted according to the number of cavity elements disposed in the cavity portions.

Core vias (not shown in FIG. 8) may be generated in the glass substrate 21 through defect generation and the etching process. The core vias may be formed through the same process as the cavity portion or an independent process.

Although not shown in the drawing, after the etching process, an electrically conductive layer may be formed on a surface of glass (including the surface of the glass substrate, the surface of the cavity portion, and a surface of the core via). As the electrically conductive layer, a metal layer including copper metal may be typically applied, but the present disclosure is not limited thereto. A dry method implemented by applying sputtering, a wet method implemented by performing primer treatment, or the like may be used for the electrically conductive layer.

After the above process, as shown in FIG. 8, (c), the glass substrate 21 may be attached to an adhesive film such as a polyimide tape (PI tape), and cavity elements Comp 1, Comp 2, and Comp 3 may be selected and disposed in the cavity portions CAVITY 1, CAVITY 2, and CAVITY 3 (designation of positions of the cavity elements).

As shown in the drawings, Comp 1 disposed in CAVITY 1 has a smaller height than Comp 2 or Comp 3, and Comp 3 has the largest height. That is, since the cavity portions are created according to the heights or sizes of the cavity elements and the cavity elements are disposed according to the heights, the upper surface of the glass substrate 21 has a substantially flat shape with less curvature than a difference in height of the cavity elements despite the difference in height of the cavity elements.

Thereafter, as shown in FIG. 8, (d), a lamination process (lamination on top) may be performed on the first surface to form an insulating layer. When an insulating film such as an Ajinomoto Build-up Film (ABF) is laminated on the entire first surface of the glass substrate 21 and curing is performed, an insulator may be incorporated into inner spaces of the cavity portions CAVITY 1, CAVITY 2, and CAVITY 3. According to this embodiment, as shown in FIG. 8 (*e*), the upper insulating layer may be formed in a relatively flat shape in which curving, i.e., undulation, does not substantially occur.

According to an example, the insulating layer may be formed through a plurality of lamination processes. That is, a process of laminating and curing the insulating film may be performed not once but twice or more to improve the warpage phenomenon of the glass substrate, and prevent separation or detachment of the cavity elements.

The adhesive film may be removed during subsequent processes as necessary. For example, the adhesive film may be an adhesive film whose adhesive force may be reduced by irradiation with ultraviolet light or the like. The adhesive force of the adhesive film may be reduced by radiating ultraviolet rays to the adhesive film directly or through the glass core, or the like, and the adhesive film may be easily removed from the glass core.

After the insulating layer is formed on the first surface of the glass substrate 21, as shown in FIG. 8, (e), a lower insulating layer may also be formed on the surface of the second surface, and connection electrodes 42 electrically connected to the cavity elements Comp 1, Comp 2, and Comp 3 may be formed.

Thereafter, an upper layer (not shown) may be formed on the glass substrate 21, and a lower layer (not shown) may be formed under the glass substrate 21.

Since a process of forming the upper layer and the lower layer is substantially the same as that described with reference to FIGS. 5 (*a*) to (*e*), overlapping descriptions will be omitted.

The packaging substrate according to the above-described embodiments and the method of manufacturing the same may compactly mount elements having various shapes and sizes in the glass substrate, and may alleviate or eliminate undulation, which may occur in the core layer.

A packaging substrate of an embodiment and a method of manufacturing the same can alleviate undulation, which occurs when various types of elements are mounted.

Further, an embodiment provides a packaging substrate and a method of manufacturing the same capable of forming an overall flat core layer even when elements having various heights are mounted in a glass substrate.

In addition, in an embodiment, a flat insulating layer and an upper layer formed on the insulating layer can be formed on a glass substrate when a core layer becomes flat due to cavity structures having various heights.

The present specification described above has been described with reference to the embodiments shown in the drawings, but this is merely exemplary, and those skilled in the art will understand that various modifications and variations of the embodiments are possible. That is, the scope of the present specification is not limited to the above-described embodiments, and various modifications and improved forms by those skilled in the art using the basic concepts of the embodiments defined in the following claims also belong to the scope of the embodiments. Accordingly, the true technical scope of the present specification should be defined by the technical spirit of the appended claims.

What is claimed is:

1. A packaging substrate comprising a core layer, wherein the core layer comprises:

a glass substrate including a first surface and a second surface facing each other; and at least two or more cavity portions each having an opening open in a direction toward the first surface or a direction toward the second surface, and the two or more cavity portions have different depths, wherein the cavity portion comprises:

a first cavity portion open and recessed in the direction toward the first surface and having a first depth;

a second cavity portion open and recessed in the direction toward the first surface or the second surface and having a second depth deeper than the first depth; and a third cavity portion having a third depth passing through the first surface and the second surface.

2. The packaging substrate of claim 1, comprising:

at least two or more cavity elements arranged in the cavity portions and having different heights; and an insulating layer incorporated into the cavity portion, and formed on a surface of the glass substrate formed with the opening.

3. The packaging substrate of claim 2, wherein the cavity elements comprise a first cavity element arranged in the first cavity portion, a second cavity element arranged in the second cavity portion, and a third cavity element arranged in the third cavity portion, one or more connection electrodes are disposed on the first cavity element in the direction toward the first surface, one or more connection electrodes are disposed on the second cavity element in the direction toward the first surface or the second surface, and one or more connection electrodes are disposed on the third cavity element in the direction toward the first surface or the second surface.

4. The packaging substrate of claim 3, wherein one or more connection electrodes are further disposed in a direction opposite the connection electrodes with the third cavity element therebetween.

* * * * *